US012575380B2

(12) United States Patent
Kaneko et al.

(10) Patent No.: US 12,575,380 B2
(45) Date of Patent: Mar. 10, 2026

(54) EVALUATION METHOD FOR SILICON CARBIDE SUBSTRATES

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Sanda (JP); Daichi Dojima, Sanda (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 385 days.

(21) Appl. No.: 18/251,124

(22) PCT Filed: Oct. 27, 2021

(86) PCT No.: PCT/JP2021/039698
§ 371 (c)(1),
(2) Date: Apr. 28, 2023

(87) PCT Pub. No.: WO2022/092165
PCT Pub. Date: May 5, 2022

(65) Prior Publication Data
US 2023/0411225 A1 Dec. 21, 2023

(30) Foreign Application Priority Data
Oct. 28, 2020 (JP) ................................ 2020-180970

(51) Int. Cl.
*H01L 21/66* (2006.01)
*H10D 62/832* (2025.01)
*H10P 74/20* (2026.01)

(52) U.S. Cl.
CPC ....... *H10P 74/203* (2026.01); *H10D 62/8325* (2025.01)

(58) Field of Classification Search
CPC ..................................................... H01L 22/12
See application file for complete search history.

(56) References Cited

U.S. PATENT DOCUMENTS 7,221,444 B1 * 5/2007 Zhao .................. G01N 21/9501
356/237.4
2005/0133718 A1 * 6/2005 Miyamoto ......... G01N 23/2251
250/307
(Continued)

FOREIGN PATENT DOCUMENTS

CN 109071231 A 12/2018
JP 2015-179082 A 10/2015
(Continued)

OTHER PUBLICATIONS

English Translation of International Search Report from PCT/JP2021/039698 dated Dec. 7, 2021 (2 pages).
(Continued)

*Primary Examiner* — Thao P Le
(74) *Attorney, Agent, or Firm* — Calfee, Halter & Griswold LLP

(57) ABSTRACT

An object of the present invention is to provide a novel evaluation method suitable for evaluating a SiC substrate having a large diameter.
The present invention is a method for evaluating a silicon carbide substrate, the method comprising an image acquisition step of acquiring an image by making an electron beam incident at an incident angle inclined with respect to a normal line of a {0001} plane of a silicon carbide substrate, wherein the incident angle is 10° or less.

10 Claims, 8 Drawing Sheets

(a)

(b)

(56) References Cited

U.S. PATENT DOCUMENTS

| | | | |
|---|---|---|---|
| 2007/0081138 A1* | 4/2007 | Kerkhof | G03F 9/7069 |
| | | | 355/71 |
| 2007/0222038 A1* | 9/2007 | Moriwaka | H01L 21/268 |
| | | | 257/E29.004 |
| 2008/0230695 A1* | 9/2008 | Snel | G01N 21/94 |
| | | | 250/306 |
| 2010/0215273 A1* | 8/2010 | Aksenov | G03F 1/44 |
| | | | 382/190 |
| 2011/0241022 A1* | 10/2011 | Masuda | G01V 8/12 |
| | | | 438/584 |
| 2014/0008535 A1* | 1/2014 | Nojima | G01N 23/20058 |
| | | | 250/307 |
| 2014/0217423 A1* | 8/2014 | Fujita | H10H 20/825 |
| | | | 257/77 |
| 2016/0204041 A1* | 7/2016 | Kim | H10B 43/27 |
| | | | 438/14 |
| 2019/0136411 A1* | 5/2019 | Kaneko | H01L 21/02658 |
| 2019/0148107 A1* | 5/2019 | Kaneko | H01J 37/28 |
| | | | 250/311 |
| 2020/0279714 A1 | 9/2020 | Ogata et al. | |
| 2020/0279716 A1 | 9/2020 | Kaneko et al. | |
| 2021/0301421 A1 | 9/2021 | Nagaya et al. | |
| 2022/0003689 A1* | 1/2022 | Nakano | H01J 35/08 |

FOREIGN PATENT DOCUMENTS

| | | | |
|---|---|---|---|
| JP | 2017-199540 | A | 11/2017 |
| JP | 2018188327 | A | 11/2018 |
| JP | 2019-158888 | A | 9/2019 |
| TW | 202022176 | A | 6/2020 |
| WO | 2019/058440 | A1 | 3/2019 |

OTHER PUBLICATIONS

Extended European Search Report from EP Application No. 21886282.9 dated Jun. 17, 2024 (10 pages).

Ashida et al., "Crystallographic orientation dependence of SEM contrast revealed by SiC polytypes", Journal of Vacuum Science, vol. 33, No. 4, Jul. 20, 2015, pp. 1-6.

Shoji Ushio et al., "Surface Phase Diagram of 4H-SiC {0001} Step-Terrace Structures during Si-Vapor Etching in a Tac Crucible", Materials Science Forum, vol. 717-720, May 14, 2012 (May 14, 2012), pp. 573-576.

Shoji Ushio et al., "Morphological Instability of 4H-SiC (0001) Basal Plane Surface during Si-Vapor Thermal Etching", Materials Science Forum, vol. 717-720, May 14, 2012 (May 14, 2012), pp. 577-580.

* cited by examiner (a)

(b)

(a)

(b)

(a)

(b)

(a)

(b)

(a)

(b)

(a)

(b)

EVALUATION METHOD FOR SILICON CARBIDE SUBSTRATES

CROSS-REFERENCE TO RELATED APPLICATIONS

This application is a 371 of PCT Application No. PCT/JP2021/039698, filed Oct. 27, 2021, which claims priority to Japanese Application No. 2020-180970, filed on Oct. 28, 2020, the contents of which are hereby incorporated by reference as if recited in their entirety.

TECHNICAL FIELD

The present invention relates to a method for evaluating a silicon carbide substrate.

BACKGROUND ART

Silicon carbide (SiC) is known as a material that exhibits a polytype phenomenon of taking a variety of stacking structures with respect to a c-axis while having the same composition in crystallography. For this SiC, 200 or more kinds of polytypes have been confirmed. Among them, 3C-SiC, 4H-SiC, and 6H-SiC are known as polytypes having a high probability of occurrence and being important for application.

FIG. 6 illustrates a schematic view of a 4H-SiC crystal structure. FIG. 6(*a*) illustrates the 4H-SiC crystal structure viewed from a <11-20> direction. FIG. 6(*b*) illustrates the 4H-SiC crystal structure viewed from a [0001] direction. In the present specification, the notation "-" for Miller indices means a bar attached to an index immediately after the notation "-".

In addition, the notations "A, B, and C" in this drawing mean occupancy positions (corresponding to Si—C pairs) of three kinds of atoms in a hexagonal close-packed structure. In FIG. 6 illustrating the 4H-SiC crystal structure, the stacked atoms at the A and C positions correspond to a zinc-blende structure, and the stacked atoms at the B position correspond to a wurtzite structure.

In 4H-SiC and 6H-SiC, since the zinc-blende structures and the wurtzite structures are periodically stacked, a stacking direction is changed at the wurtzite structure. On the other hand, in 3C-SiC, since the zinc-blende structures are continuously stacked, a stacking direction is not changed.

There has been proposed a technique for evaluating the quality of a SiC substrate of 4H-SiC, 6H-SiC, and the like in which the stacking direction is changed, by making an electron beam incident on the SiC substrate. For example, Patent Literature 1 and Patent Literature 2 describe a technique for evaluating the quality of a SiC substrate on the basis of an image obtained by making an electron beam incident on a surface of the SiC substrate at an incident electron angle inclined with respect to a normal line of a {0001} plane of the SiC substrate.

CITATION LIST

Patent Literature

Patent Literature 1: JP 2015-179082 A
Patent Literature 2: JP 2019-158888 A

SUMMARY OF INVENTION

Technical Problem

FIG. 7 illustrates a schematic view of the method for evaluating a SiC substrate described in Patent Literatures 1 and 2. FIG. 7(*a*) illustrates a state in which a SiC substrate 10 to be evaluated is installed on a stage 20 of a scanning electron microscope. FIG. 7(*b*) illustrates a crystal structure of a surface of the SiC substrate 10.

As illustrated in FIG. 7, in the conventional method for evaluating a SiC substrate, the image is acquired by making an electron beam PE incident on the SiC substrate 10 at an incident angle θ inclined by 30° to 40° with respect to a normal line N of the {0001} plane of the SiC substrate 10.

Cost reduction is one of urgent issues in spreading SiC semiconductor devices. As with the development of Si semiconductor devices, the cost reduction largely depends on an increase in diameter of a semiconductor substrate. This is because a substrate (wafer) having a larger area can increase the number of semiconductor chips obtained from one substrate, so that a manufacturing cost per chip can be reduced. Therefore, the importance of a method for evaluating a SiC substrate having a large diameter is increasing.

However, in the method for evaluating a SiC substrate described in Patent Literatures 1 and 2, it is necessary to incline the stage 20 at 30° to 40° to acquire an image I. Therefore, there is a problem that a measurement device for measuring the SiC substrate 10 (particularly a chamber of the scanning electron microscope accommodating the SiC substrate 10) becomes large.

The method for evaluating a SiC substrate described in Patent Literatures 1 and 2 also has a problem in that the electron beam PE is easily defocused when scanning the SiC substrate 10 having a large diameter.

In this measurement method, 0.5 to several nm of the surface of the SiC substrate is evaluated. However, in the conventional method, the stage 20 is inclined at 30° to 40° to acquire the image I. Therefore, it is necessary to precisely control the stage 20 so as not to cause the surface of the SiC substrate 10 to deviate from a focal position of the electron beam PE.

However, it is difficult to continue focusing the electron beam PE on the surface position of the SiC substrate 10 when scanning a wide area with the stage 20 being inclined at 30° to 40°. That is, when the stage 20 is moved while keeping the large inclination angle of 30° to 40°, the stage 20 moves along an irradiation direction of the electron beam PE (moves in a height direction of the stage 20), so that the electron beam is easily defocused.

FIG. 8 illustrates a schematic view illustrating a movement amount when the SiC substrate 10 is scanned. FIG. 8(*a*) illustrates a state in which the SiC substrate 10 having a small area is evaluated. FIG. 8(*b*) illustrates a state in which the SiC substrate 10 having a large area is evaluated. As described above, there are the problems that as the area of the SiC substrate 10 to be evaluated increases, the chamber needs to have a larger size, and the focal point tends to deviate.

In view of the above-described problems, an object of the present invention is to provide a novel evaluation method suitable for evaluating a SiC substrate having a large diameter.

Solution to Problem

To achieve the above-described object, the present invention is a method for evaluating a SiC substrate, the method including an image acquisition step of acquiring an image by making an electron beam incident at an incident angle inclined with respect to a normal line of a {0001} plane of a SiC substrate,
the incident angle being 10° or less.

As described above, by setting the incident angle to 10° or less, it is possible to reduce a chamber accommodating the SiC substrate in size. In addition, when a SiC substrate having a large diameter is scanned, it is possible to suppress deviation of a surface of the SiC substrate from a focal position of the electron beam.

A preferred mode of the present invention includes an oxide film removal step of removing an oxide film of the SiC substrate, and the image acquisition step is performed after the oxide film removal step.

As described above, by removing the oxide film, it is possible to acquire information on the surface of the SiC substrate accurately.

In a preferred mode of the present invention, the image acquisition step is a step of acquiring the image with the SiC substrate being exposed to ambient air for a time length of 60 minutes or less after the oxide film removal step.

As described above, since the exposure time of the SiC substrate to the ambient air is 60 minutes or less, the information on the surface of the SiC substrate can be accurately acquired.

In a preferred mode of the present invention, the image includes a plurality of pieces of brightness information reflecting a stacking direction of atoms, the preferred mode including a brightness comparison step of comparing the brightness information.

In a preferred mode of the present invention, the image includes first brightness information reflecting a first stacking direction and second brightness information reflecting a second stacking direction, the preferred mode including the brightness comparison step of comparing the first brightness information with the second brightness information.

In a preferred mode of the present invention, the incident angle is inclined to a <1-100> direction with respect to the normal line.

In a preferred mode of the present invention, an acceleration voltage of the electron beam is 1.0 kV or less.

In a preferred mode of the present invention, a diameter of the silicon carbide substrate is 4 inches or more.

Advantageous Effects of Invention

According to the disclosed technology, it is possible to provide the novel evaluation method suitable for evaluating the SiC substrate having a large diameter.

Other objects, features, and advantages will become apparent from reading the following description of embodiments when taken in conjunction with the drawings and the claims.

DESCRIPTION OF EMBODIMENTS

Figure 1:
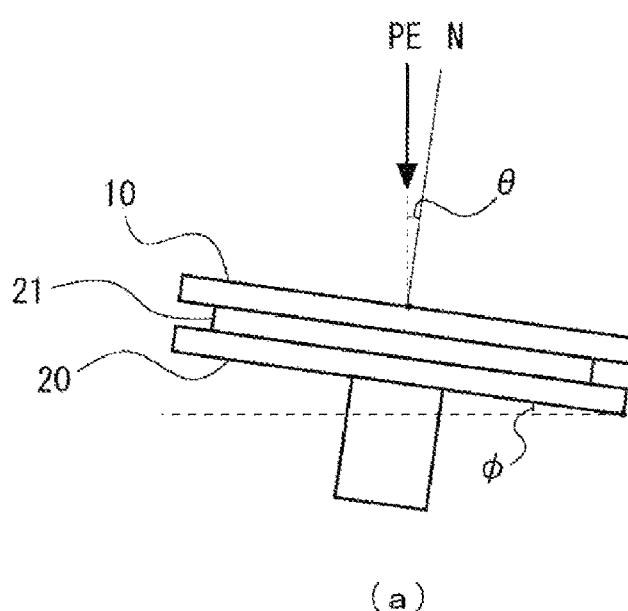
FIG. 1 is a schematic view of a method for evaluating a SiC substrate according to an embodiment.
Figure 1:
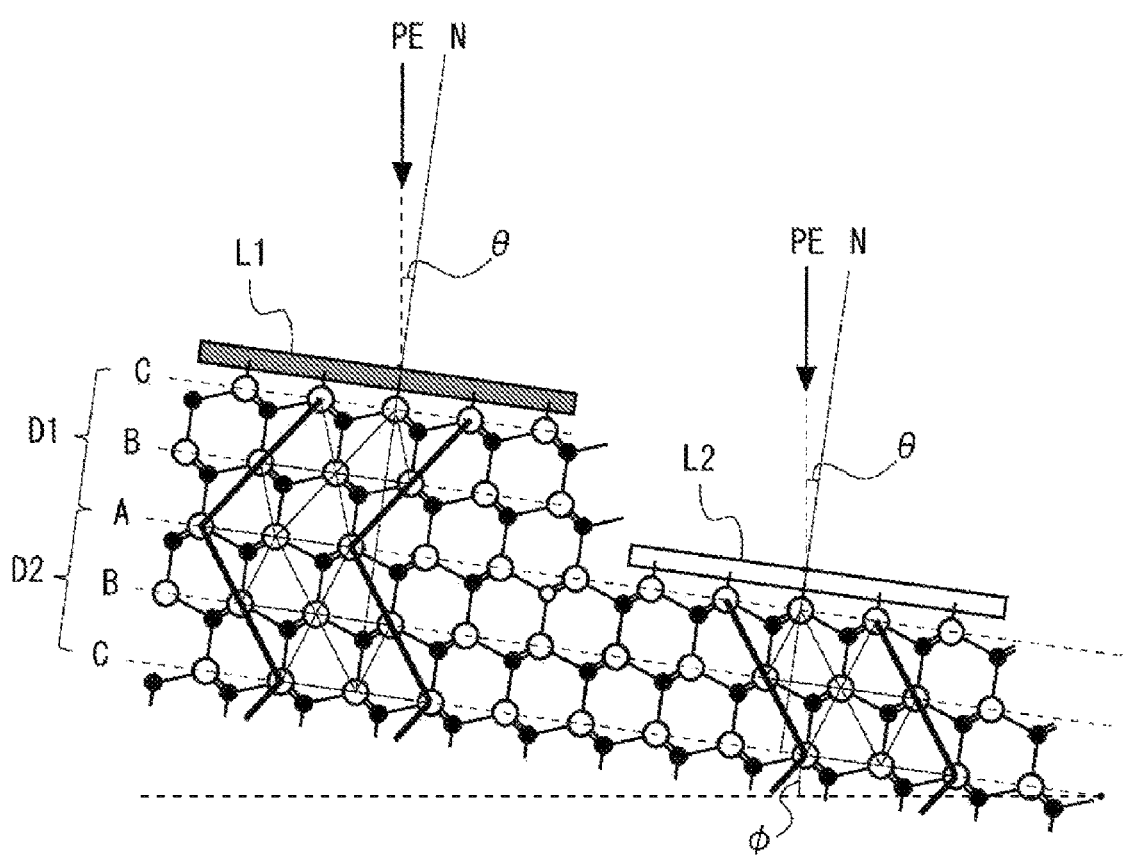

Hereinafter, a preferred embodiment of a method for evaluating a SiC substrate according to the present invention will be described in detail with reference to the accompanying drawings. The technical scope of the present invention is not limited to the embodiments illustrated in the accompanying drawings, and can be appropriately changed within the scope described in the claims. In the following description of the embodiments and the accompanying drawings, the same reference numerals are given to the same components, and redundant description is omitted.

FIG. 1 is a schematic view of the method for evaluating a SiC substrate 10 according to the present invention. FIG. 1(a) illustrates a state in which the SiC substrate 10 to be evaluated is installed on a stage 20, and an electron beam PE is incident on the SiC substrate 10 at an incident angle θ of 8°. FIG. 1(b) illustrates a crystal structure of a surface of the SiC substrate 10 of FIG. 1(a).

The method for evaluating a SiC substrate according to the present invention is characterized in that an image I is acquired by making the electron beam PE incident at the incident angle θ of 10° or less with respect to a normal line N of a {0001} plane of the SiC substrate 10.

The method for evaluating a SiC substrate according to the embodiment includes an oxide film removal step of removing an oxide film on the surface of the SiC substrate an image acquisition step of acquiring the image I by making the electron beam PE incident at the incident angle θ inclined with respect to the normal line N of the {0001} plane of the SiC substrate 10, and a brightness comparison step of comparing brightness information L included in the image I.

A diameter of the SiC substrate 10 is preferably 4 inches or more, more preferably 6 inches or more, and still more preferably 8 inches or more.

Hereinafter, each of the steps of the embodiment of the present invention will be described in detail.

<Oxide Film Removal Step>

The oxide film removal step is a step of removing the oxide film formed on the surface of the SiC substrate to expose crystal structures of Si and C on the surface of the SiC substrate 10. As a method for removing the oxide film, a method of removing the oxide film by a solution of hydrogen fluoride (HF), ammonium fluoride ($NH_4F$), or the like, and a method of removing the oxide film by dry etching or in a gas phase of plasma or the like can be adopted.

In addition, the oxide film removal step includes an etching method and a crystal growth method of the SiC substrate 10. That is, no oxide film is formed on the surface of the SiC substrate 10 after etching or growth. Therefore, the etching method and the crystal growth method of the SiC substrate 10 can be reasonably adopted as the oxide film removal step.

Examples of the etching method include a hydrogen etching method using hydrogen gas as etching gas, and a Si-vapor etching (SiVE) method of performing heating under a Si atmosphere.

Examples of the crystal growth method include a chemical vapor deposition (CVD) method, a physical vapor transport (PVT) method, and a metastable solvent epitaxy (MSE) method.

5

6

<Image Acquisition Step>

As illustrated in FIG. 1, the image acquisition step is a step of acquiring the image I by making the electron beam PE incident on the SiC substrate 10 at the incident angle θ inclined with respect to the normal line N of the {0001} plane of the SiC substrate 10. The incident angle θ is, the incident angle θ is preferably 10° or less, more preferably 9° or less, and still more preferably 8° or less. In addition, the incident angle θ is preferably 5° or more, more preferably 6° or more, still more preferably 7° or more, and still more preferably 8° or more.

The image acquisition step includes an installation step of installing the SiC substrate 10 to be evaluated on the stage 20 of a scanning electron microscope, an inclination step of inclining the stage 20 at an inclination angle φ where the electron beam PE is incident at the incident angle θ of 10° or less with respect to the normal line N of the {0001} plane of the SiC substrate 10, and an electron beam irradiation step of irradiating the SiC substrate 10 with the electron beam PE to obtain the image I.

At the inclination step, the stage is preferably inclined such that the electron beam PE is inclined to a <1-100> direction with respect to the normal line N of the SiC substrate 10.

In addition, at the inclination step, the incident angle θ of the electron beam PE is preferably in a range between 5° and 10°, more preferably in a range between 7° and 9°, and still more preferably 8°.

At the electron beam irradiation step, the irradiation with the electron beam PE is preferably performed at an acceleration voltage of 1.0 kV or less.

The image I is created on the basis of electrons (reflected electrons) obtained when the electron beam PE (primary electrons) emitted by an electron emission unit of the scanning electron microscope is bounced back on the surface of the SiC substrate 10, or emitted after the electron beam PE interacts with the SiC substrate 10, and electrons (secondary electrons) generated during the interaction.

That is, a detector disposed in the scanning electron microscope detects the reflected electrons and/or the secondary electrons, and the image I is created on the basis of positional information of the SiC substrate 10 and the detection results of the respective electrons.

When the image I is acquired at the image acquisition step, the SiC substrate 10 is exposed to the ambient air for a time length of preferably 60 minutes or less, more preferably 50 minutes or less, still more preferably 40 minutes or less, and still more preferably 30 minutes or less after the oxide film removal step.

That is, when the incident angle θ is 10° or less, the image I is more easily affected by the oxide film than in a conventional case where the incident angle θ is 30° to 40°. Therefore, by performing measurement with the SiC substrate 10 being exposed to the ambient air for the time length of 60 minutes or less, the brightness information L of the image I becomes clear.

<Brightness Comparison Step>

The brightness comparison step is a step of comparing a plurality of pieces of the brightness information L reflected in the image I. The brightness information L is information regarding contrast reflecting a stacking direction of atoms. By comparing the plurality of pieces of brightness information L, it is possible to obtain information on the surface of the SiC substrate 10.

For example, the brightness comparison step is a step of comparing first brightness information L1 reflecting the stacking direction of atoms with second brightness information L2 capable of being compared with the first brightness information L1. Specifically, the first brightness information L1 and the second brightness information L2 are contrasted to obtain the information regarding the contrast, whether the first brightness information L1 is white or black.

Figure 2:
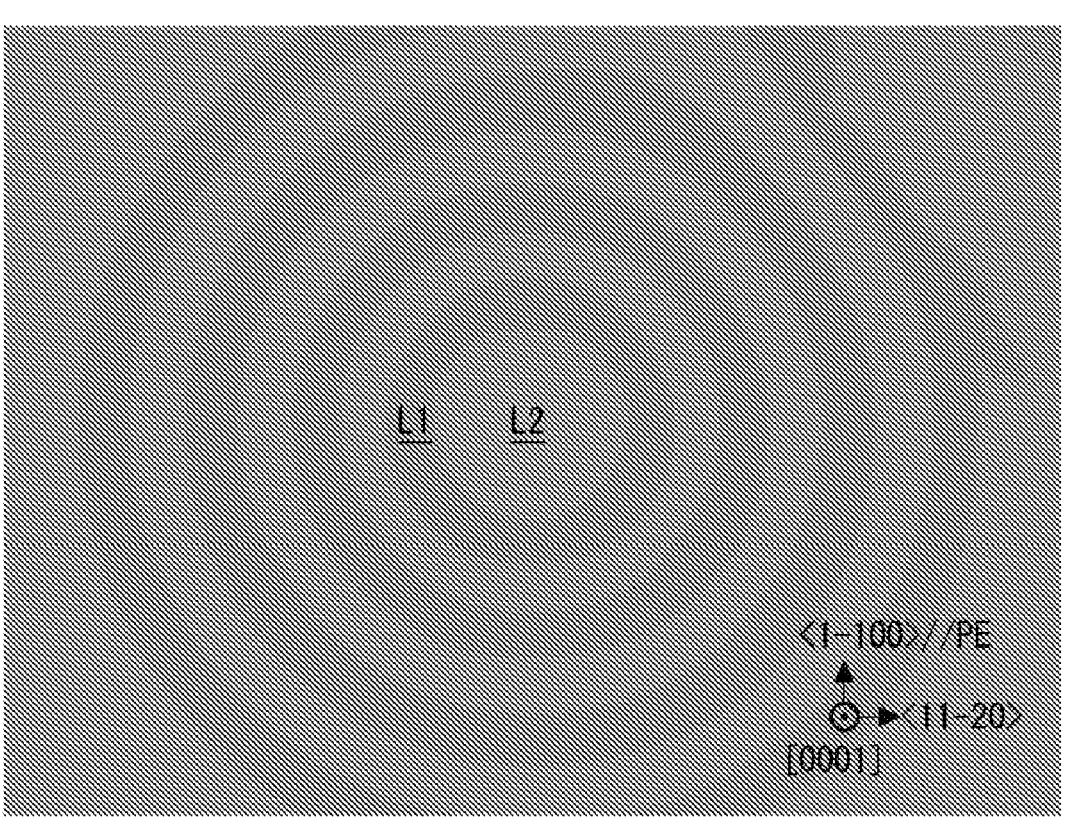
FIG. 2 is an example of an image I (SEM image) obtained by the method for evaluating a SiC substrate according to the embodiment.

FIG. 2 is an example of the image I obtained at the image acquisition step. The image I has the plurality of pieces of brightness information L reflecting the number of SiC unit layers and/or stacking directions of the SiC unit layers. The brightness information L has a plurality of variations depending on a combination of the number of SiC unit layers, and a first stacking direction D1 (a direction in which the Si atoms are stacked as A→B→C) and a second stacking direction D2 (a direction in which the Si atoms are stacked as C→B→A).

FIG. 2 includes the first brightness information L1 reflecting a crystal structure in which two SiC unit layers are stacked in the first stacking direction D1 (a crystal structure in which the Si atoms are stacked as A→B→C), and the second brightness information L2 reflecting a crystal structure in which two SiC unit layers are stacked in the second stacking direction D2 (a crystal structure in which the Si atoms are stacked as C→B→A).

Although FIGS. 1 and 2 illustrate the case where 4H-SiC has the two pieces of brightness information L, 4H-SiC may have third brightness information L3 reflecting a crystal structure in which one SiC unit layer is stacked.

In addition, the method for evaluating a SiC substrate according to the present invention can similarly evaluate any polytype in which the stacking direction is changed. For example, in 6H-SiC, the variation of the brightness information L is determined by a combination of three SiC unit layers, and a first stacking direction (a direction in which the Si atoms are stacked as A→B→C→A) and a second stacking direction (a direction in which the Si atoms are stacked as A→C→B→A).

According to the present invention, the electron beam PE is made incident at the incident angle θ of 10° or less with respect to the normal line N of the {0001} plane of the SiC substrate 10. This makes it possible to reduce a measurement device in size.

Figure 3:
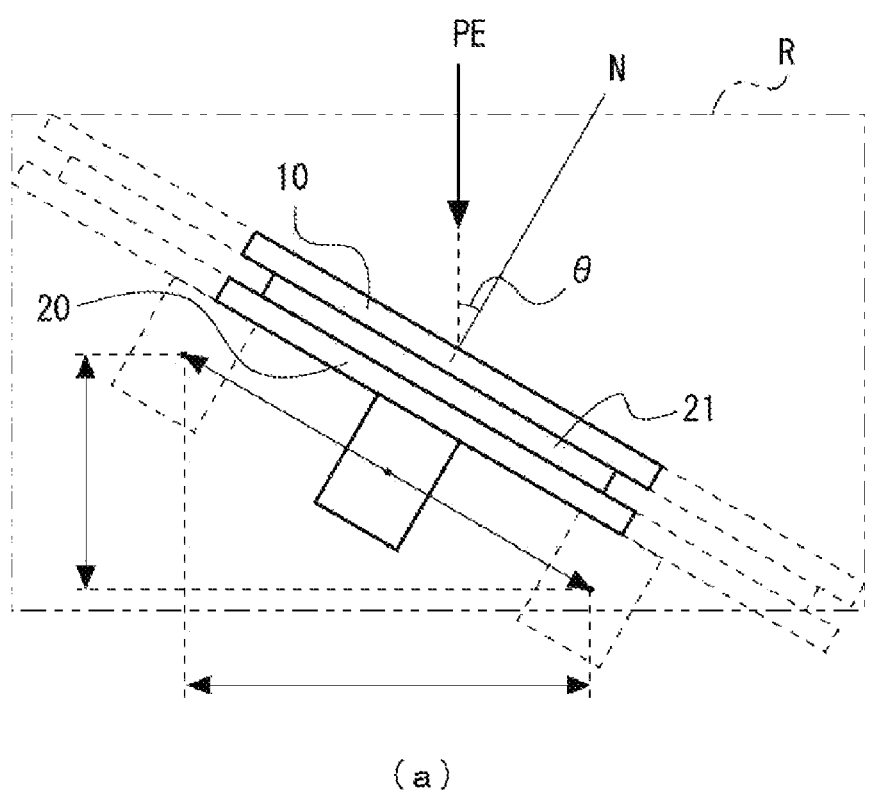
FIG. 3 is a schematic view of the method for evaluating a SiC substrate according to the embodiment and a conventional method for evaluating a SiC substrate.
Figure 3:
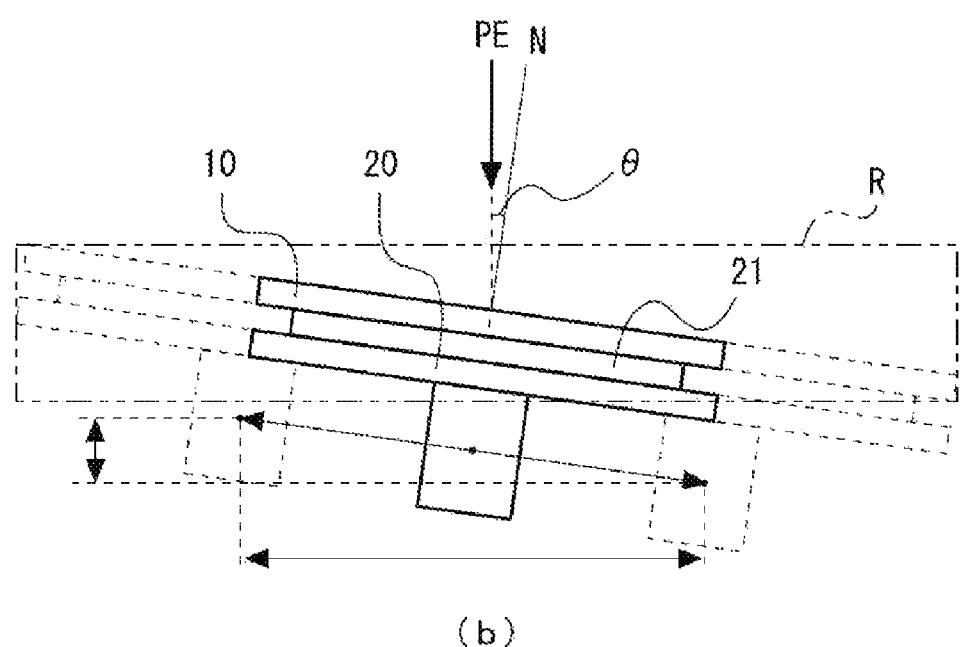

FIG. 3 is an explanatory view illustrating a movement amount of the SiC substrate 10 and the stage 20. FIG. 3(*a*) illustrates a state in which the SiC substrate 10 is scanned at the incident angle θ of 30°, and corresponds to a conventional method for evaluating a SiC substrate. FIG. 3(*b*) illustrates a state in which the SiC substrate 10 is scanned at the incident angle θ of 8°, and corresponds to the method for evaluating a SiC substrate according to the present invention.

Although the SiC substrates 10 and the stages 20 have the same sizes in FIG. 3, a range (two-dot chain line portion) in which the SiC substrate 10 moves is smaller in the method for evaluating a SiC substrate according to the present invention. That is, by setting the incident angle θ to 10° or less, it is possible to reduce the size of a chamber accommodating the SiC substrate 10 and to reduce a device cost.

In addition, according to the present invention, the electron beam PE is made incident on the SiC substrate 10 at the incident angle θ of 10° or less with respect to the normal line N of the {0001} plane of the SiC substrate 10. As a result, it is possible to reduce deviation of a focal point from the surface of the SiC substrate 10 along with the movement of the stage 20.

For example, in a case where a 6-inch wafer (diameter: 15.24 cm) is scanned from one end to another in a state of being inclined at 30°, the wafer moves 7.62 cm in a height direction of the stage 20. On the other hand, in a case where the 6-inch wafer is scanned in a state of being inclined at 8°, the wafer moves 2.12 cm in the height direction of the stage 20.

In addition, in a case where an 8-inch wafer (diameter: 20.32 cm) is scanned from one end to another in a state of being inclined at 30°, the wafer moves 10.16 cm in the height direction of the stage 20. On the other hand, in a case where the 8-inch wafer is scanned in a state of being inclined at 8°, the wafer moves 2.82 cm in the height direction of the stage 20.

As described above, since the movement amount in the height direction of the stage 20 can be reduced, it is possible to reduce the deviation of the focal position.

EXAMPLES

Hereinafter, the present invention will be described more specifically with reference to Examples 1 and 2. Note that the present invention is not limited to the Examples.

Example 1

The SiC substrate 10 was evaluated under the following conditions.
<SiC Substrate 10>
  Semiconductor material: 4H-SiC
  Off-angle: 4°
  Off-direction: [11-20]
<Oxide Film Removal Step>
  Oxide film removal method: Si-vapor etching
  Heating temperature: 1800° C.
  Heating time: 60 minutes
<Image Acquisition Step>
  Scanning electron microscope: Merline manufactured by Zeiss
  Acceleration voltage: 1 kV
  Inclination direction: parallel to <1-100>
  Incident angle θ: 8°
  Exposure time to the ambient air: 60 minutes
<Brightness Comparison Step>
  FIG. 4(*a*) is the image I acquired at the image acquisition step according to Example 1. The SiC substrate 10 exposed to the ambient air for 60 minutes was measured at the incident angle θ of 8°. In this case, the first brightness information L1 and the second brightness information L2 can be grasped. That is, information on the crystal structure of the outermost surface of the SiC substrate, information on a step shape, information on a step height, information on a distance to any place, and the like can be acquired from the image I acquired in Example 1.

Example 2

The SiC substrate 10 was evaluated under the following conditions.
<SiC Substrate 10>
  The SiC substrate 10 having the same conditions as those of Example 1 was used.
<Oxide Film Removal Step>
  The oxide film was removed under the same conditions as in Example 1.
<Image Acquisition Step>
  Scanning electron microscope: Merline manufactured by Zeiss
  Acceleration voltage: 1 kV
  Inclination direction: parallel to <1-100>

Figure 4:
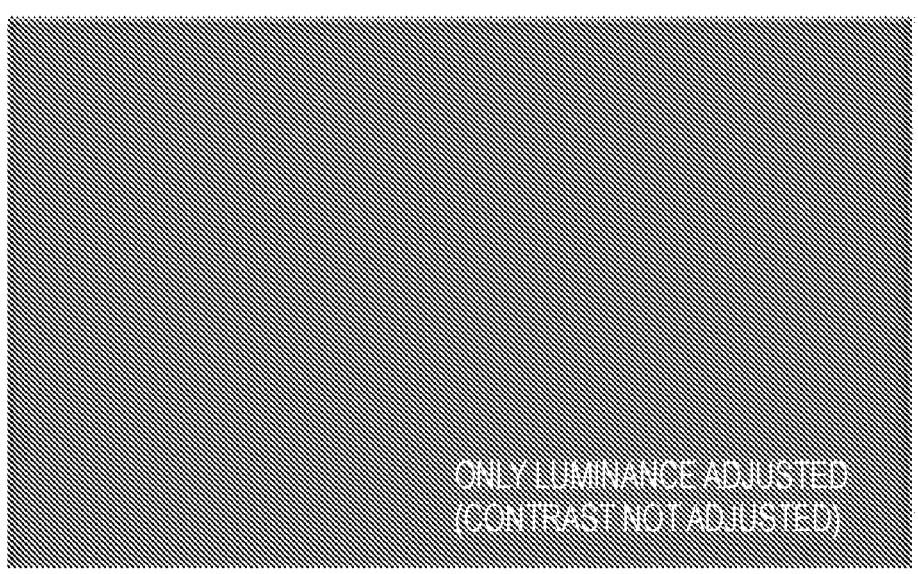
FIG. 4 is the image I of Example 1 and the image I of Example 2.
Figure 4:
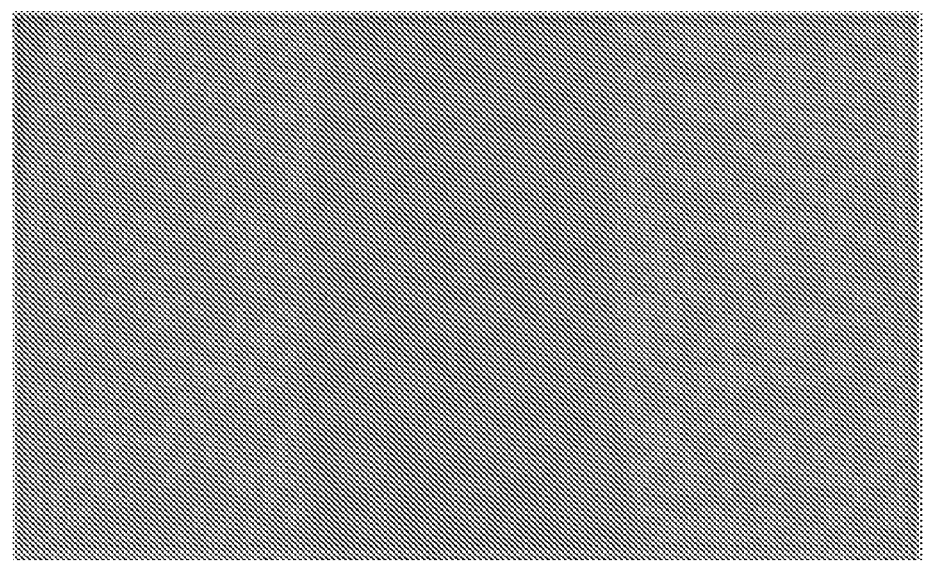

Incident angle θ: 8°
  Exposure time to the ambient air: 5 minutes
<Brightness Comparison Step>
  FIG. 4(*b*) is the image I acquired at the image acquisition step according to Example 2. The SiC substrate 10 exposed to the ambient air for 5 minutes was measured at the incident angle θ of 8°. In this case, the first brightness information L1 and the second brightness information L2 can be grasped more clearly than in Example 1. That is, from the comparison between Example 1 and Example 2, it is found that the brightness information L can be accurately acquired by shortening the exposure time to the ambient air.

Figure 5:
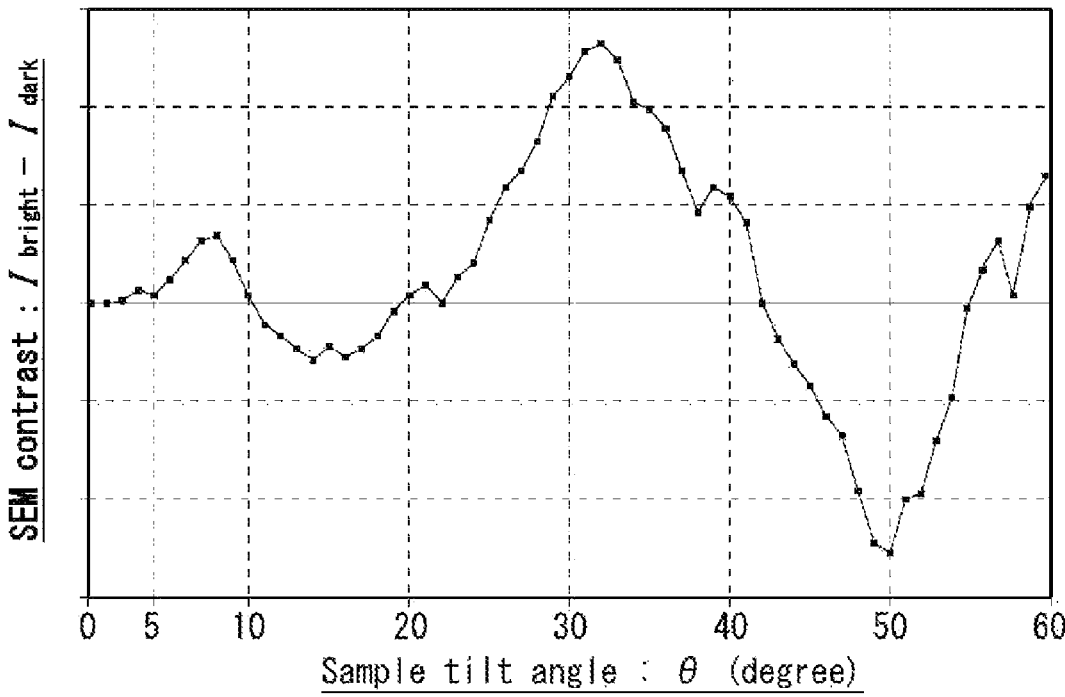
FIG. 5 is a graph illustrating a relationship between an incident angle θ of an electron beam PE and brightness information.
Figure 6:
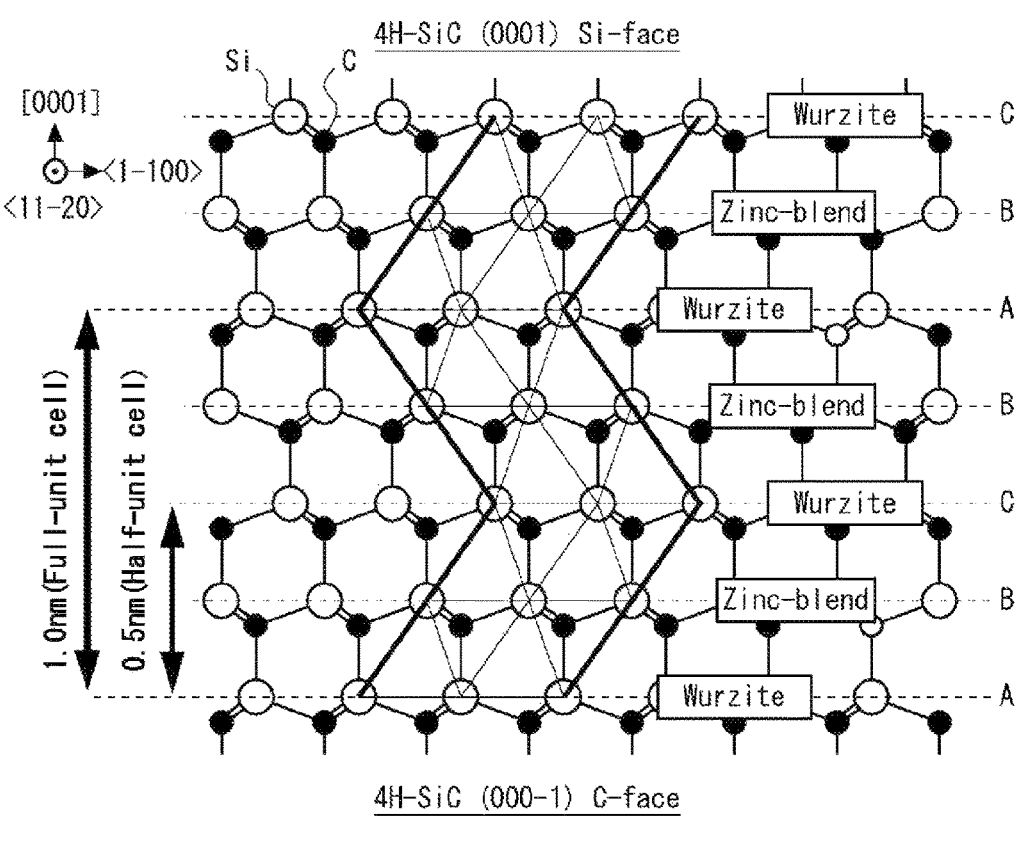
FIG. 6 is a schematic view of a 4H-SiC crystal structure.
Figure 7:
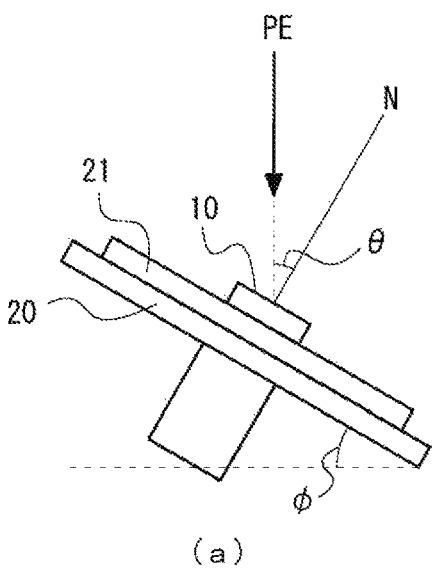
FIG. 7 is a schematic view of the conventional method for evaluating a SiC substrate.
Figure 7:
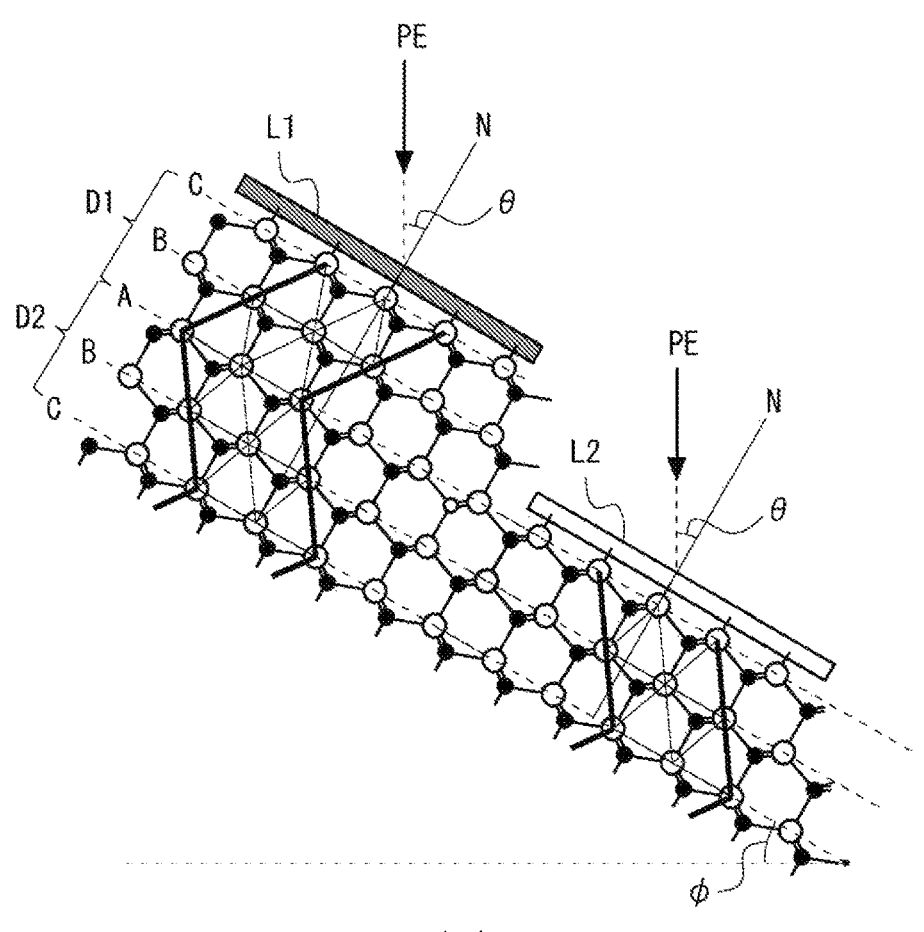
Figure 8:
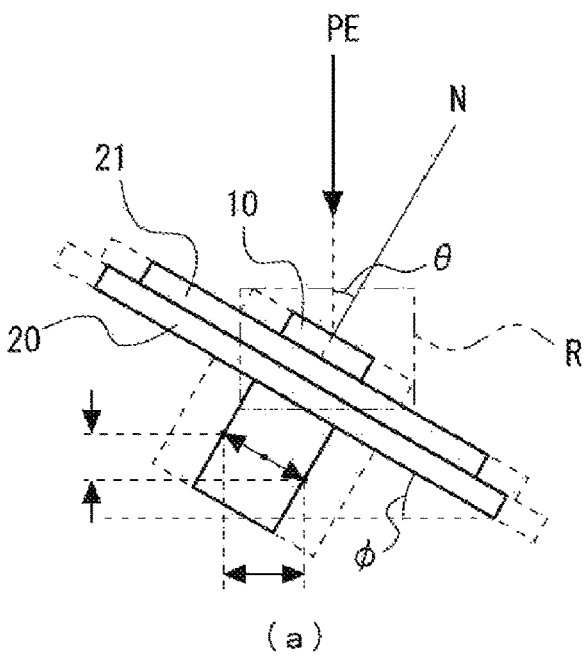
FIG. 8 is a schematic view of the conventional method for evaluating a SiC substrate.
Figure 8:
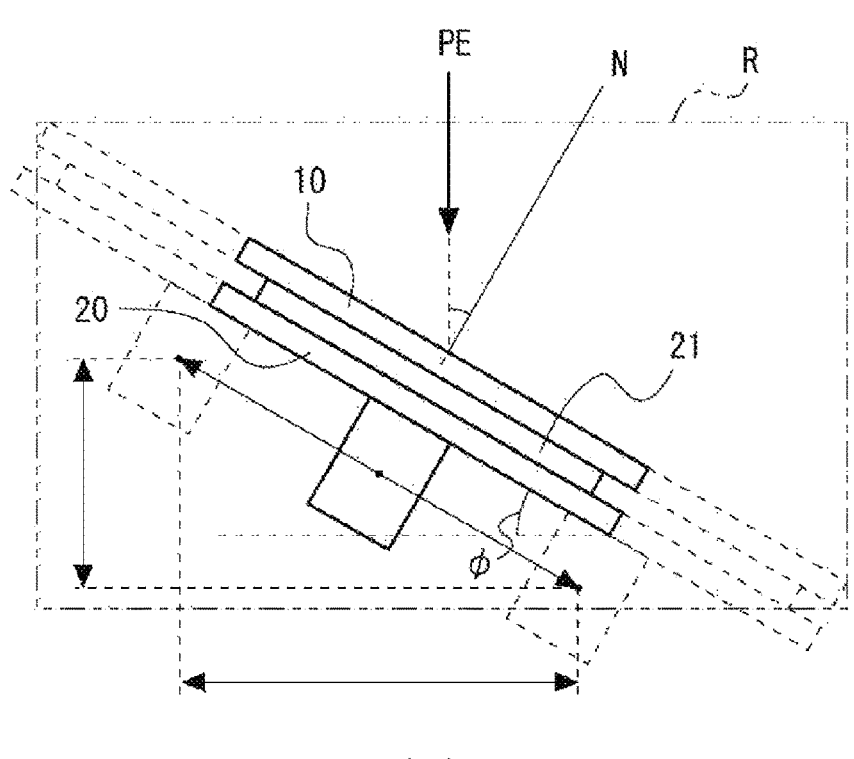

FIG. 5 is a graph illustrating a relationship between the incident angle θ and the contrast using the SiC substrate 10 of Example 2. The horizontal axis in FIG. 5 is the incident angle θ of the electron beam PE with respect to the normal line N of the {0001} plane of the SiC substrate 10. The vertical axis in FIG. 5 is a value obtained by converting the contrast into numerical form by subtracting the second brightness information L2 (dark portion) from the first brightness information L1 (bright portion) on the image I.

FIG. 5 shows that the contrast value is maximized at the incident angle θ between 30° and 40° inclusive. Meanwhile, in a case where the measurement is performed at the incident angle θ between 30° and 40° inclusive, there arises problems that the measurement device becomes large and the electron beam PE is defocused at the time of measuring the SiC substrate 10 having a large diameter. Therefore, the inventors have found that the brightness information L can be obtained at the incident angle θ of 10° or less as well.

The present invention includes the image acquisition step of acquiring the image I by making the electron beam PE incident at the incident angle θ inclined with respect to the normal line N of the {0001} plane of the SiC substrate 10, the incident angle θ being 10° or less. As a result, the measurement chamber of the scanning electron microscope can be reduced in size as compared with the conventional case where the incident angle θ is set to 30° to 40°.

In addition, according to the present invention, it is possible to suppress the deviation of the focal point at the time of measuring the substrate having a large diameter. By making the electron beam PE incident at the incident angle θ smaller than that in the conventional method, it is possible to reduce the moving distance of the stage 20 in the irradiation direction of the electron beam PE when the SiC substrate 10 having a large diameter is scanned. As a result, when the SiC substrate 10 having a large diameter is scanned, it is possible to suppress the deviation of the surface of the SiC substrate 10 from the focal position of the electron beam PE.

The present invention also includes the oxide film removal step of removing the oxide film of the SiC substrate 10. As described above, by removing the oxide film formed on the SiC substrate 10, it is possible to acquire the brightness information L on the image I more clearly.

In addition, according to the present invention, the image acquisition step is a step of acquiring the image I with the SiC substrate 10 being exposed to the ambient air for the time length of 60 minutes or less after the oxide film removal step.

As described above, since the exposure time of the SiC substrate 10 to the ambient air is 60 minutes or less, the brightness information L on the image I can be acquired more clearly.

REFERENCE SIGNS LIST

10 SiC substrate
20 Stage

9

21 Substrate fixing means
D1 First stacking direction
D2 Second stacking direction
PE Electron beam
I Image
L Brightness information
L1 First brightness information
L2 Second brightness information
N Normal line
θ Incident angle
φ Inclination angle

The invention claimed is:

1. A method for evaluating a silicon carbide substrate, the method comprising an image acquisition step of acquiring an image by making an electron beam incident at an incident angle inclined with respect to a normal line of a {0001} plane of a silicon carbide substrate, wherein the incident angle is in a range between 7° and 9°.

2. A method for evaluating a silicon carbide substrate, the method comprising:

an oxide film removal step of removing an oxide film of the silicon carbide substrate, and an image acquisition step of acquiring an image by making an electron beam incident at an incident angle inclined with respect to a normal line of a {0001} plane of a silicon carbide substrate;

wherein the image acquisition step is performed after the oxide film removal step.

3. The method for evaluating a silicon carbide substrate according to claim 2, wherein the image acquisition step is a step of acquiring the image with the silicon carbide substrate being exposed to ambient air for a time length of 60 minutes or less after the oxide film removal step.

4. The method for evaluating a silicon carbide substrate according to claim 1, wherein the image includes a plurality of pieces of brightness information reflecting a stacking direction of atoms, the method comprising a brightness comparison step of comparing the plurality of pieces of brightness information.

5. The method for evaluating a silicon carbide substrate according to claim 1, wherein the image includes first brightness information reflecting a first stacking direction and second brightness information reflecting a second stacking direction, the method comprising the brightness comparison step of comparing the first brightness information with the second brightness information.

6. The method for evaluating a silicon carbide substrate according to claim 1, wherein the image acquisition step is a step of making incident the electron beam inclined to a <1-100> direction.

7. The method for evaluating a silicon carbide substrate according to claim 1, wherein at the image acquisition step, an acceleration voltage of the electron beam is 1.0 kV or less.

8. The method for evaluating a silicon carbide substrate according to claim 1, wherein a diameter of the silicon carbide substrate is 4 inches or more.

9. The method for evaluating a silicon carbide substrate according to claim 2, wherein the incident angle is 10° or less.

10. The method for evaluating a silicon carbide substrate according to claim 2, wherein the incident angle is in a range between 7° and 9°.

* * * * *